United States Patent [19]

Subbarao et al.

[11] Patent Number: 4,617,461
[45] Date of Patent: Oct. 14, 1986

[54] FLUORESCENT OPTICAL SWITCH AND KEYBOARD APPARATUS

[75] Inventors: Wunnava V. Subbarao, Miami, Fla.; Richard I. Ely, Flemington, N.J.

[73] Assignee: Burroughs Corporation, Detroit, Mich.

[21] Appl. No.: 603,876

[22] Filed: Apr. 25, 1984

[51] Int. Cl.$^4$ ............................................... G01D 5/34
[52] U.S. Cl. ................................. 250/229; 340/36 SP
[58] Field of Search .............. 250/221, 229, 234, 235, 250/462.1; 330/59, 308; 340/36 SP

[56] References Cited

U.S. PATENT DOCUMENTS 4,379,968  4/1983  Ely et al. ............................. 250/229
4,480,182  10/1984  Ely et al. ........................ 250/229 X

Primary Examiner—Eugene R. Laroche
Assistant Examiner—Steven J. Mottola
Attorney, Agent, or Firm—Carl Fissell, Jr.; Kevin R. Peterson; Edmund M. Chung

[57] ABSTRACT

Fluorescent optical switch and keyboard apparatus wherein a plurality of fluorescent optical key switches are arranged in a matrix array of rows and columns with a key disposed at each column-row intersection and wherein each key carries a fluorescent optically reflective element thereon. A single optical photo-diode disposed at each key location is caused to operate in three discrete modes with respect to the fluorescent element. In one mode the diode emits light which is caused to be reflected upon key when the key is depressed. In another mode the reflected light striking the diode causes the diode to act as a photo-receptor effectively indicating key actuation.

7 Claims, 6 Drawing Figures

FLUORESCENT OPTICAL SWITCH AND KEYBOARD APPARATUS

BACKGROUND OF THE INVENTION

1. Field of the Invention

This invention relates generally to photo-optical keyboard apparatus and more specifically to the concept of utilizing a single photo-optical component as both a light generator and light detector in a matrix array for use, for example, in a keyboard.

2. Description of the Prior Art

The vast majority of presently available photo-optical keyboard constructions utilize multiple light generators and multiple light detectors. Usually, these components are arranged in rows and columns with the light generators disposed at the row positions and the light detectors disposed at the column positions or vice versa depending on the designer's choice.

This multiplicity of component assemblies is not only expensive but also complicated to assemble, maintain and operate as a result of the miniaturization involved. In addition, the printed wiring boards which are required for such apparatus are also expensive to produce due to the complex circuitry employed with the multiplicity of component assemblies.

SUMMARY OF THE INVENTION

The present invention is based upon the concept that a single component can be employed to perform two completely different though related functions. In the present instance, it has been discovered that one discrete electrical component, namely an optical-photo diode, is capable of functioning both as a light generating device as well as a light detecting device by means of suitable electronic circuitry. By coating the movable portion of a key switch (blade) with fluorescent material and arranging the key blade adjacent to the active portion of a common photo-diode, the photo-diode through suitable biasing can be caused to first emit light and then to detect the reflected light emitted by the fluorescent material on the key blade. Thus by moving the key under finger pressure, for example, the light emitted by the LED causes fluorescence in the material which persists long enough to be detected by the LED when it is later biased as a detector. The light is caused to be reflected back onto the diode which now acts as a photoreceptor due to the timed change in bias producing an output signal indicating that the switch has been activated or closed.

By arranging a plurality of fluorescent optical key switches in an array matrix of rows and columns, a low-cost, photo-optical keyboard has been conceived. The electronics involved is fairly straightforward and inexpensive and provides a keyboard with N-key rollover as well as the typical keyboard features of conventional keyboards but with the greatly reduced component complexity while increasing component and system reliability. The construction is capable of operating at very low voltage and current levels which in turn reduces the heat generated while tending to increase overall reliability of the system.

BRIEF DESCRIPTION OF THE DRAWINGS

FIGS. 7A, 7B comprise a combined functional schematic and associated waveforms for a row driver for the keyboard of the subject inventions.

DESCRIPTION OF THE PREFERRED EMBODIMENT

In order to minimize the number of light generating and receiving devices, e.g., LEDs and photodetectors, it has been proposed to employ the same physical component both as a light emitter as well as a light detector in a switching mechanism. It is further proposed to provide a keyboard array utilizing these same components in a matrix arrangement effectively reducing the number of previously required separate light generators and detectors.

Figure 1:
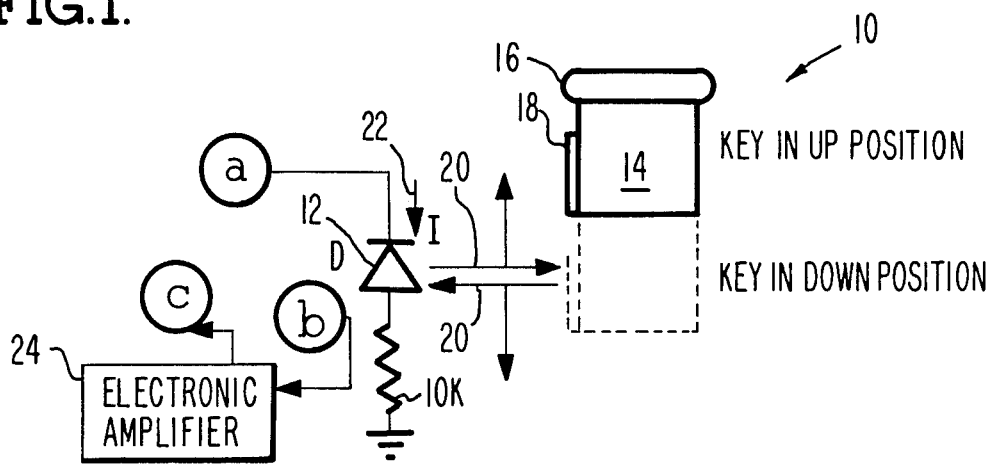
FIG. 1 is a schematic diagram of the fluorescent key concept of the present invention.

As shown in the highly diagrammatic schematic illustration of FIG. 1, a switching device 10 in accordance with the present invention, is seen to include a conventional photodiode 12 which is disposed adjacent to the movable portion, e.g., blade 14, of a keyboard key member 16. The confronting (facing) portion of blade 14 is provided with a fluorescent light reflective surface 18 thereon.

In the "up" or inactive position of switch 10, the light rays 20 exiting from LED 12 are ineffective since the reflective surface 18 is out of position relative to the active portion of the LED. However, in the "down" or active position of switch 10, the light rays 20 are reflected back from the fluorescent surface 18 onto the active surface of the diode 12.

Figure 2:
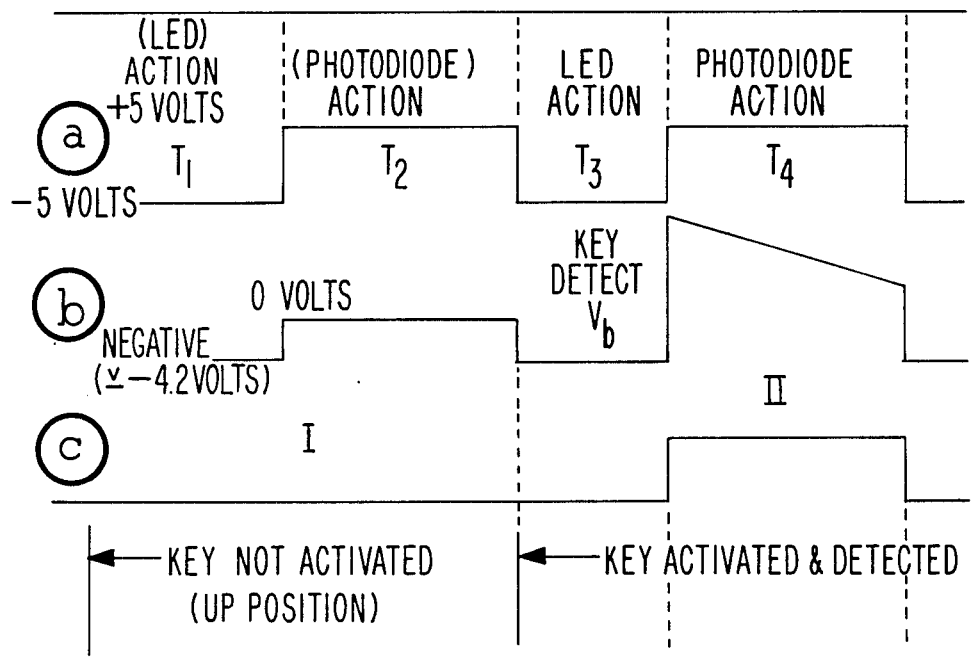
FIG. 2 are waveforms illustrating the LED and photoreceptor actions of the photodiode of the present invention.
Figure 3:
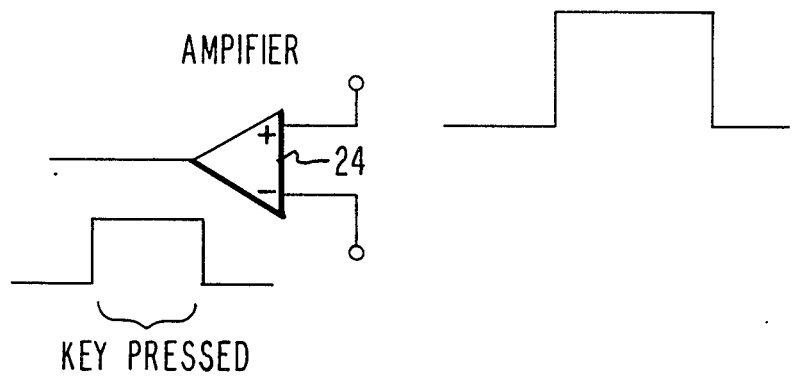
FIG. 3 is a schematic illustration of the comparator amplifier and waveforms for the invention.

Diode 12 is first forward biased, FIG. 1, so that the diode acts as a light emitting member (LED) when point ⓐ is driven negative during time $T_1$ (FIG. 2). During this time node ⓑ is also negative. During time $T_2$, point ⓐ is driven positive. Diode 12 is now reverse biased and acts as a photodiode detecting the light incident on surface 18. The key surface coating 18 comprises a fluorescent material which has the property of retaining optical energy and gradually re-emitting this energy in the form of light as required.

With key 16 in the "up" or inactive position (not pressed), no light will be incident upon surface 18 and there will be no light retention. Point ⓑ will be near 0 volts as seen in Section I of FIG. 2 (trace 2).

When key 16 is depressed or activated to the "down" position, during time $T_1$ (when diode 10 is acting as an LED), light from the diode strikes the fluorescent surface 18 of key 16 and optical energy is voluntarily retained by the surface. During time $T_2$, (Section II of the diagram), this surface becomes a light emitter and the emitted rays 20 now strike the diode 12 which acts as a photodiode. This action causes a photocurrent I to flow through diode 12 generating a positive going signal at ⓑ as seen at $T_2$ in FIG. 2, (Section II). This signal signifies that key 16 has been activated or pressed "down". Processing this signal through an electrical amplifier 24 provides a clean logic signal at ⓒ FIG. 2, as shown at Section II $T_2$. The optical retentivity of the fluorescent material coating 18 should last for a minimum of a few milliseconds in order to give a conclusive (positive) light output during interval $T_2$ Section II.

The construction in accordance with the present invention minimizes the requirement for numerous photodiodes and photodetectors as well as simplifying the associated electronics effectively providing a noise-free switching apparatus.

Fluorescent photo-optical keyboard apparatus 26 conceived in accordance with the teaching of this invention is illustrated diagrammatically in more or less detail in FIGS. 4, 5 and 6, which will be described hereinafter.

Figure 4:
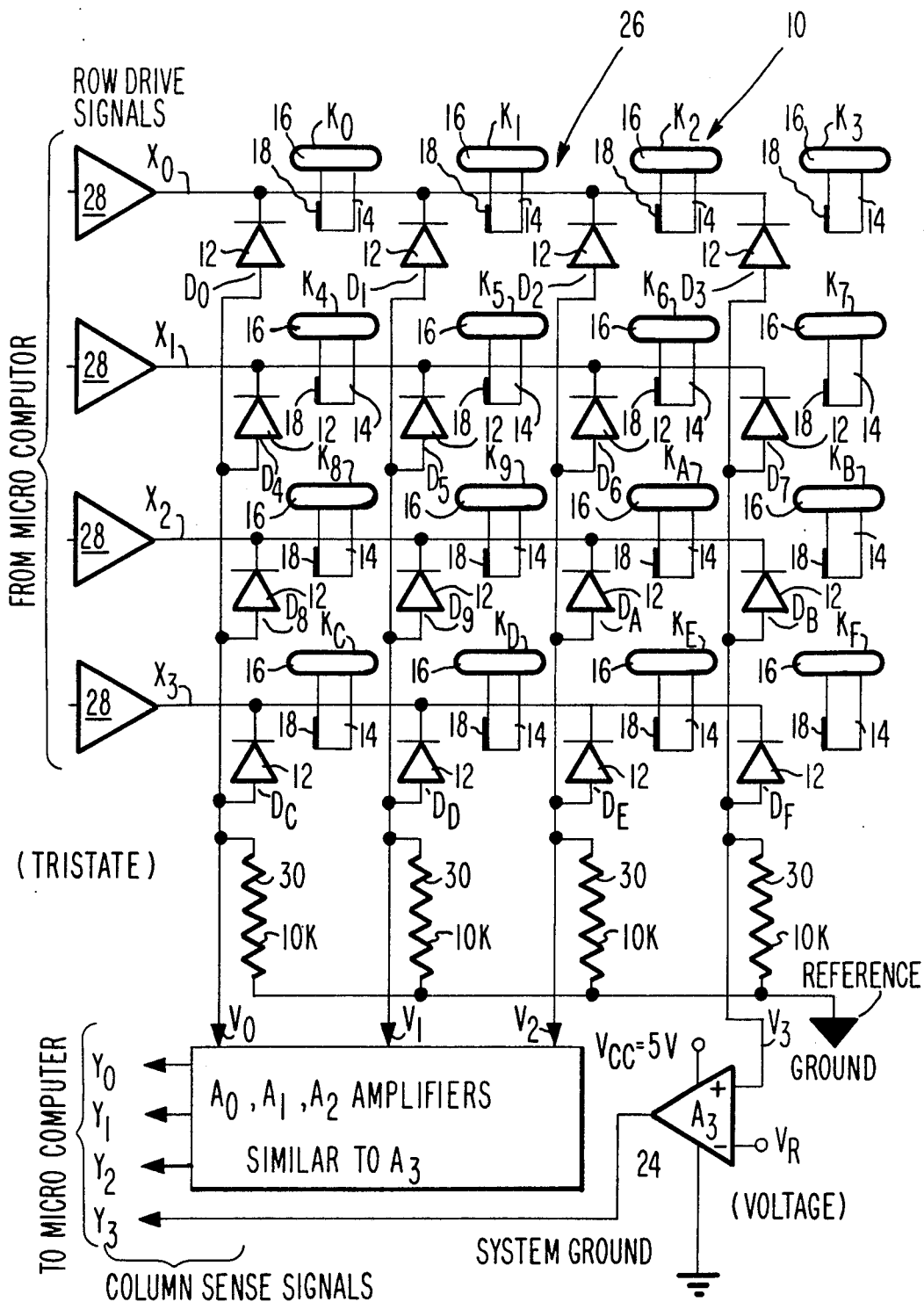
FIG. 4 is a diagrammatic illustration of a photo-optical keyboard in accordance with the present invention.

As seen first in FIG. 4, the keyboard 26 comprises 16 fluorescent optical switching devices 10 arranged in a 4×4 array matrix (hex keyboard of 16 keys identified as 16).

Figure 5:
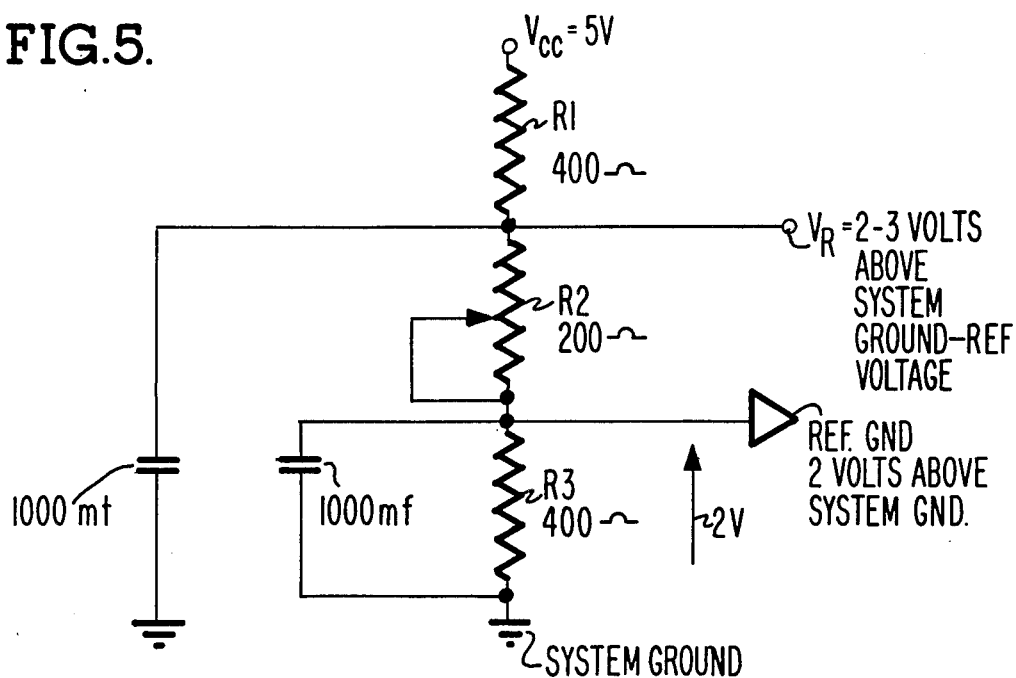
FIG. 5 is a schematic representation of a power supply for the keyboard implementation of the invention.

The power distribution is shown schematically in FIG. 5 and is intended to be self-explanatory as applied to the keyboard of FIG. 4. It is noted that FIG. 5 exemplifies an amplifier as designated $A_3$ in FIG. 4.

The schematically illustrated keyboard of FIG. 4 comprises an array of rows and columns of keys 16 arranged in the previously mentioned 4×4 matrix. Each key stem or blade 14 carries a fluorescent coating 18 and is disposed adjacent to a respective opto-electronic component, e.g., a photodiode 12. The rows of keys are identified as $K_0$ through $K_f$ inclusive, while the diodes 12 are labeled $D_0$ through $D_f$ inclusive.

The diodes 12 are disposed in columns (as shown in FIG. 4) and are serially, electrically coupled to respective amplifiers identified as $A_0$, $A_1$, $A_2$, and $A_3$ of electrical amplifier package 24. The negative poles of diodes 12 are electrically serially connected to a respective row driver 28, each of which is capable of responding to three states of operation, as earlier described in connection with FIG. 1.

The outputs of amplifiers $A_0$ through $A_3$ are individually connected to an operably associated microcomputer over lines identified as $Y_0$ through $Y_3$, respectively. Bias resistors 30 are connected between the positive pole of each diode and the reference ground connection.

Figure 6:
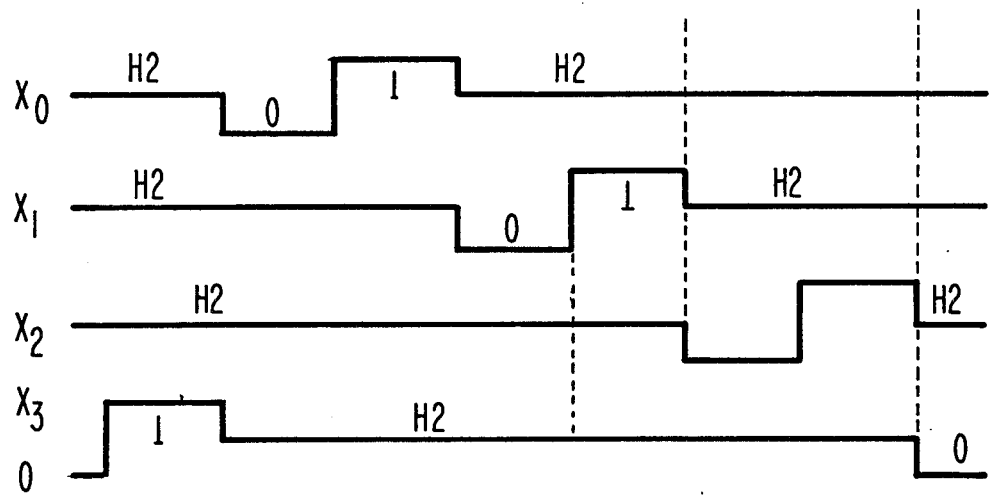
FIG. 6 illustrates the drive waveforms for the keyboard of the subject invention.

With the voltages and currents as shown in FIG. 5 and FIG. 6 when $X_0$ is driven "low", i.e., near system ground, diodes $D_0$ through $D_3$ become immediately forward biased and act as LEDs, emitting light. If any one of the keys ($K_0$ through $K_3$), 16 are actuated, i.e., depressed, fluorescent surface 18 is exposed to the light and stores optical energy for emission later on.

When $X_0$ is driven high (near $V_{cc}$, substantially equal to 5 volts) $D_0$ through $D_3$ become reverse biased and act as photodiodes. The light emitted by any key surface now actuated (which has been exposed before and is now storing optical energy), strikes the corresponding diode 12 producing a photocurrent through this latter member. This causes the corresponding voltages $V_0$ through $V_3$ to go more positive than the reference voltage $V_R$, which in turn causes the system output lines $Y_0$ through $Y_3$ to go high (refer to FIG. 4). By observing the relationship between X and Y signals, it then becomes possible to identify the key being actuated. Any signals on output lines $Y_0$ through $Y_3$ indicates those keys in row $X_0$ were depressed. To scan row $X_1$, $X_0$ is pulled to a $H_2$ state so no signal can flow and the cycle is repeated for the keys in row $X_1$. For example if $X_0$ is activated and $V_2$ and hence $Y_2$ is observed to be active high signal it amounts to key $K_2$ being activated which is common element for $X_0$ row and $Y_2$ column. This is illustrated in FIG. 4. Thus $K_0 \ldots K_3$ activations determined when $X_0$ is activated.

When $X_0$ is pulled to a $H_z$ (high impedance) state, Row 0 is effectively disconnected. By activating $X_1$, it is possible to determine $K_4$ through $K_7$ key actuations, and so on.

The complete scanning of the keyboard is accomplished by sequentially actuating row drivers for $X_0$ through $X_3$ and observing $Y_0$ through $Y_3$. It is noted that actuations of X signifies the steps of pulling it first low, then high and finally into its tri-state (3rd state).

FIG. 6 illustrates $X_0$ through $X_3$ waveforms during operation of the system. The microcomputer easily generates such a set of waveforms and accepts $Y_0$ through $Y_3$ signals and validates which key or keys have been actuated.

Thus, if $Y_0$ through $Y_3=0100$ during $X_0$ at high level, this signals that key $K_1$ is actuated. On the other hand, if $Y_0$ through $Y_3=1100$ when $X_2$ is activated, this signals two keys $K_C$ and $K_D$ have been actuated. The microprocessor will generate a logic low or high on a data line, connected to the input of a tri-state bus driver device such as SN 4LS241. Also it will generate a tri-state control signal. The composite effect is a waveform similar to -$X_0$-, as shown in FIGS. 7A and 7B.

Thus, the system effectively provides for N-key rollover while maintaining all other functions of conventional keyboards while simultaneously greatly reducing the number of relatively expensive components required for the system. Each row is scanned, one at a time and $Y_0 \ldots Y_3$ provide information about wich key or keys are deactivated. Thus, each key has unique identification code in terms of X signals and -Y- signals and can be identified uniquely. In case of multiple closure the keys are identified in scanning sequence. This is the property of -N- key rollover, which the present system has.

What is claimed is:

1. Fluorescent optical switch and keyboard apparatus comprising:
   photo-optical means adapted to operate in a light emitting, a light receiving and a passive mode,
   fluorescent means disposed adjacent to said photo-optical means and capable of movement from a light blocking to a light passing position, and
   circuit means interconnected to said photo-optical means for energizing said photo-optical means to a level causing said photo-optical means to emit light for impingement upon said fluorescent means when said fluorescent means is disposed in a light fluorescent position, said circuit means thereafter biasing said photo-optical means so as to cause said photo-optical means to act as light receptor and to generate an electrical signal output indicating the actuation of the device.

2. The combination according to claim 1 wherein said photo-optical means further comprises a photo-diode.

3. The combination according to claim 1 wherein said fluorescent means is carried by the key stem of a photo-optical keyboard.

4. The combination according to claim 1 wherein said fluorescent means comprises a fluorescent coating on a support structure.

5. Fluorescent optical switch and keyboard apparatus comprising:

a matrix array of rows and columns of keys arranged to form a keyboard, a photo-diode disposed adjacent to the key stem of each key, a fluorescent material having a delay time commensurate with the response time of said photo-diode coated on one portion of said key stem, electrical circuit means for biasing said photo-diode first in a forward direction so as to cause the diode to emit light for impingement upon the fluorescent material and for then biasing said photo-diode in the reverse direction causing said diode to act as a light receptor, and microprocessor means for controlling the electrical signals input to and output from said photo-diode effective to indicate key actuation.

6. The combination according to claim 5 further including a row driver for each row of photo-diode and being capable of responding to three discrete states of operation of said diodes.

7. The combination according to claim 5 wherein said microprocessor means further includes a separate amplifier for each column of photo-diode.

* * * * *